United States Patent [19]

Farmer et al.

[11] Patent Number: 4,668,364

[45] Date of Patent: May 26, 1987

[54] PORTABLE ELECTROPLATING APPARATUS

[76] Inventors: Fred W. Farmer, 1861 Foxworthy Ave.; Frank E. Farmer, 1687 Hyacinth La., both of San Jose, Calif. 95124

[21] Appl. No.: 865,622

[22] Filed: May 21, 1986

[51] Int. Cl.$^4$ .................... C25D 17/00; C25D 21/12; C25D 3/48

[52] U.S. Cl. ................ 204/224 R; 204/228; 204/271; 204/109

[58] Field of Search ............... 204/224 R, 271, 109, 204/228; 200/11 D

[56] References Cited

U.S. PATENT DOCUMENTS

| | | | |
|---|---|---|---|
| 1,866,699 | 7/1932 | Conlin | 204/224 R |
| 2,046,440 | 7/1936 | Adey | 204/224 R X |
| 2,128,331 | 8/1938 | Schlötter | 204/224 |
| 3,470,082 | 9/1969 | Raymond et al. | 204/228 |
| 3,520,792 | 7/1970 | Kerschgens | 204/271 X |
| 3,637,468 | 1/1972 | Icxi et al. | 204/224 R X |
| 3,752,752 | 8/1973 | Slatin et al. | 204/224 R X |
| 4,495,045 | 1/1985 | Jackson | 204/271 X |

FOREIGN PATENT DOCUMENTS 1042059  9/1966  United Kingdom ............... 204/228

*Primary Examiner*—Donald R. Valentine
*Attorney, Agent, or Firm*—Flehr, Hohbach, Test, Albritton & Herbert

[57] ABSTRACT

A portable electroplating apparatus (10) includes a case (12) having a plurality of containers (18, 20, 22, 24 and 26) in the case (12) for a plating solution and for preparing metal objects for electroplating. An electroplating circuit (64) is mounted in the case (12) and configured to provide plating current through an anode (44) and cathode (38) to the plating solution in one of the containers (18-26). A cord (30) connects the electroplating circuit (64) to a 120 volt AC outlet for powering the apparatus (10).

6 Claims, 4 Drawing Figures

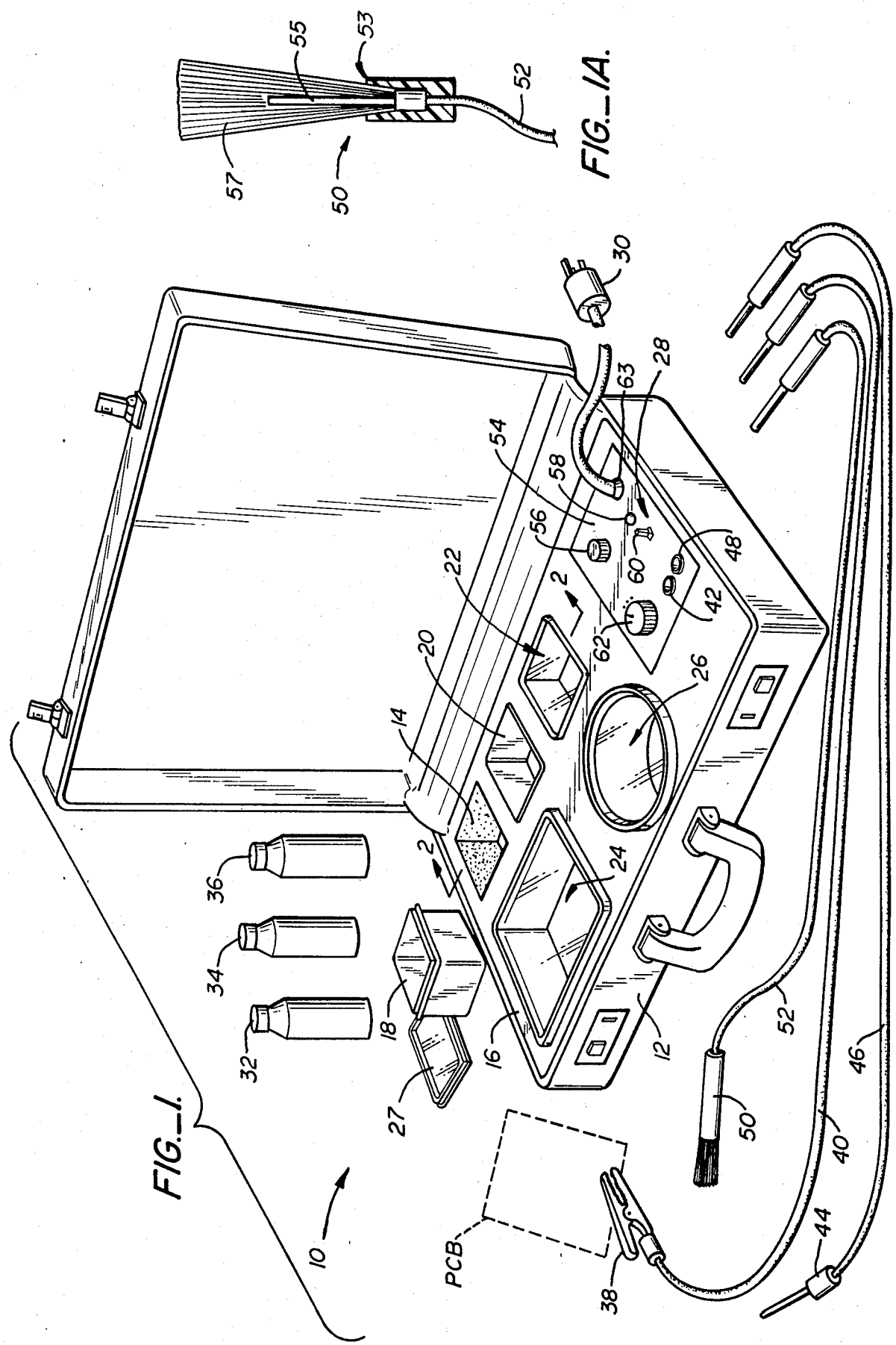

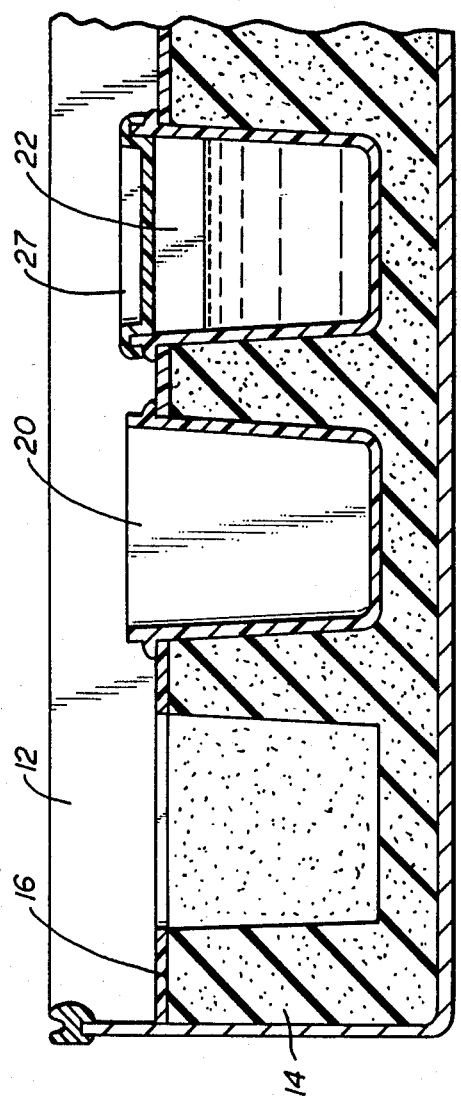
FIG._2.
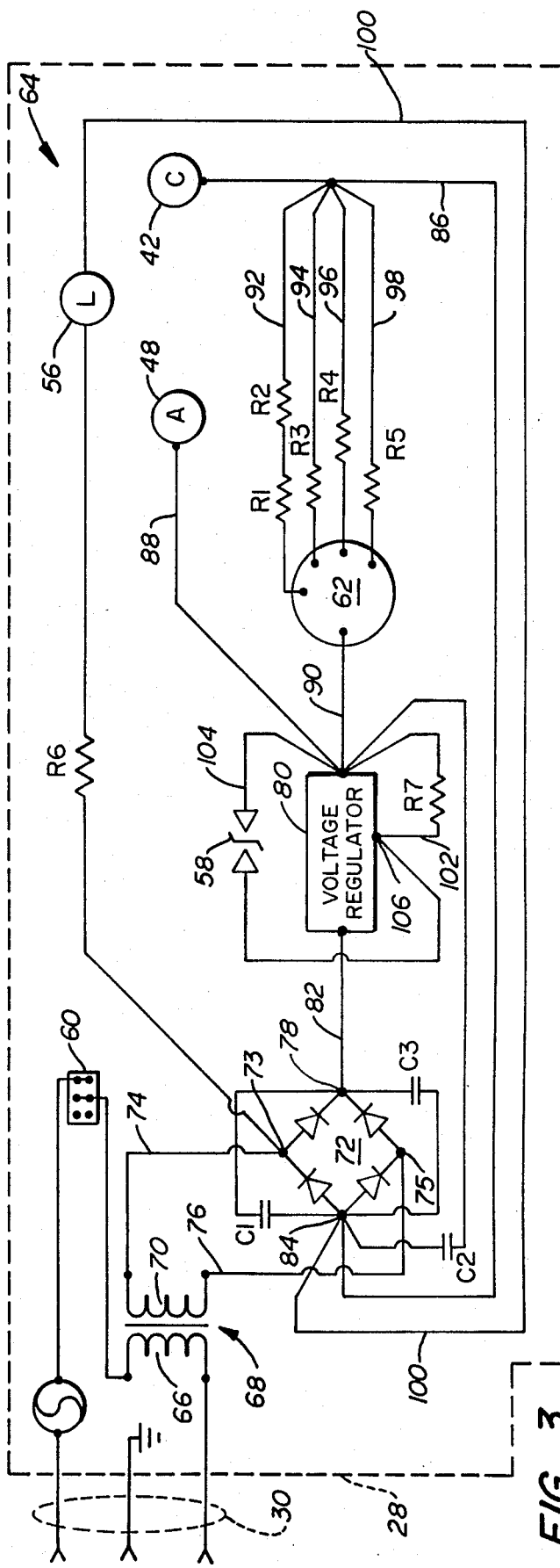
FIG._3.

PORTABLE ELECTROPLATING APPARATUS

BACKGROUND OF THE INVENTION

1. Field of the Invention

This invention relates to a novel form of electroplating apparatus that enables electroplating operations to be carried out in different locations readily. More particularly, it relates to such an electroplating apparatus that is easily carried from place to place, so that small scale electroplating can be done in locations of the user's choice. Most especially, it relates to such apparatus that permits custom electroplating of different articles at a customer's facility.

2. Description of the Prior Art

Large scale brush and dip electroplating apparatuses and processes are known in the art. As conventionally practiced, the apparatus is provided in a manufacturing plant or laboratory in a fixed location, and articles to be plated are brought to the apparatus. For large scale manufacturing of plated articles, this approach is entirely satisfactory. However, for custom plating of individual articles or a small number of articles, the prior art approach requires that the customer deliver the articles to a plating facility or that an employee of the plater pick up the articles to be plated and return them to the customer after plating.

One specific example of an electroplating operation for which the typical prior art approach is unsatisfactory is the electroplating of edge contacts on printed circuit boards during routine servicing and maintenance of electronic equipment. In order to take such circuit boards to a remote facility for replating of their electrical contacts, either a customer's electronic equipment is inoperative for the time required to take the board to the facility for replating and return to the customer's facility or it is necessary to swap printed circuit boards. These alternatives are either inconvenient or increase the cost of such serving and maintenance.

There are a wide variety of other custom plating situations in which it would be desirable to be able to provide electroplating operations at a customer's facilities, such as in the plating of jewelry and novelty items.

SUMMARY OF THE INVENTION

Accordingly, it is an object of this invention to provide an easily portable electroplating apparatus.

It is another object of the invention to provide such an easily portable electroplating apparatus that is usable in a wide variety of different locations without special facilities.

It is a further object of the invention to provide such an easily portable electroplating apparatus that can be used without special training or experience in electroplating.

The attainment of these and related objects may be achieved through use of the novel portable electroplating apparatus herein disclosed. A portable electroplating apparatus in accordance with this invention includes a case having a plurality of containers provided in the case for a plating solution and for preparing metal objects for the electroplating. An electroplating circuit is mounted in the case and is configured to provide plating current through an anode and a cathode to a plating solution in one of the plurality of containers. The electroplating anode and cathode are provided in the case for connection to the electroplating circuit.

In use of the electroplating apparatus, the case is brought to a location where it is desired to carry out the electroplating. The surface of a metal object to be electroplated is cleaned with a metal cleaning solution. The metal cleaning solution is removed from the metal object with a detergent solution and rinsed. The metal object is connected to the cathode. The metal object and the anode are then allowed to contact the plating solution, but not one another. Either brush or dip electroplating may be employed.

The attainment of the foregoing and related objects, advantages and features of the invention should be more readily apparent to those skilled in the art, after review of the following more detailed description of the invention, taken together with the drawings, in which:

BRIEF DESCRIPTION OF THE DRAWINGS

FIG. 1 is a perspective view of a portable electroplating apparatus in accordance with the invention.

FIG. 2 is a cross section view taken along the line 2—2 in FIG. 1.

FIG. 3 is a schematic diagram of an electroplating circuit used in the apparatus of FIG. 1.

DETAILED DESCRIPTION OF THE INVENTION

Turning now to the drawings, more particularly to FIGS. 1 and 2, there is shown a portable electroplating apparatus 10. The apparatus 10 is provided in a conventional attache case 12. Inside the case 12 is a foam rubber block 14 overlaid with a sheet of plastic 16, both with cutouts for a plurality of polyethylene or other plastic containers 18, 20, 22, 24 and 26, and a circuit board 28 having an electroplating circuit mounted on the board and a three lead electrical cord 30 for connection to a 120 volt AC source. As is best shown in FIG. 2, the containers 18–26 have snap on lids 27. Three solution bottles 32, 34 and 36 are provided containing a metal cleaning solution, a detergent, and a metal plating solution, respectively. The apparatus 10 can be used for plating any suitable metal, for example, gold, silver, copper, rhodium, nickel, or the like. For this description, the metal to be plated is gold, and the metal plating solution in the bottle 36 is gold chloride. Such a gold chloride solution is well known in the electroplating art, and contains dilute acids, emetics and metallic salts. The metal cleaning solution in bottle 32 is implemented with commercially available Towle Jewelry Cleaner. The detergent in bottle 34 is a commercially available biodegradable laundry detergent, containing anionic surfactants, complex sodium phosphates, sodium carbonate, sodium sulfate, sodium silicates, and an antiredeposition agent. An alligator clip contact 38 is connected by lead 40 to cathode banana receptacle 42. A dip plating anode 44 is connected by lead 46 to anode banana receptacle 48. The dip plating anode 44 is formed from 24 kt. gold. For brush plating, a brush plating anode 50 is connected by lead 52 to the anode banana receptacle 48 in place of the dip plating anode. The brush plating anode consists of an artist's brush 53 with a 24 kt. gold wire 55 extending into the bristles 57 of the brush and terminating about ¼ inch from the tips of the bristles 57.

A front panel 54 is provided on the circuit board 28. The front panel 54 includes a fuse 56, an LED 58 which is lighted when power switch 60 is turned on, and a 1 pole-4 position switch 62 for selecting different power output levels, depending on the size of an object to be plated. The electrical cord 30 is attached at 63.

Details of electroplating circuit 64 mounted on the circuit board 28 are shown in FIG. 3. Power cord 30 is connected through switch 60 to primary winding 66 of transformer 68. Secondary winding 70 of the transformer 68 is connected across a diode bridge rectifier 72 at nodes 73 and 75 by lines 74 and 76 to provide a 6.3–12 volt DC output at node 78, which is supplied as $V_{in}$ to voltage regulator integrated circuit 80 on line 82. The voltage regulator integrated circuit 80 may be implemented with a commercially available LM117, LM217 or LM317KC voltage regulator integrated circuit, available from National Semiconductor Corporation, Santa Clara, CA. Node 84 is connected to the cathode receptacle 42 by line 86. Output $V_{out}$ of the integrated circuit 80 is supplied on line 88 to the anode receptacle 48. Output $V_{out}$ is supplied on line 90 to the rotary switch 62, and through resistors R1 and R2, R3, R4 and R5 and lines 92, 94, 96 and 98, respectively, to line 86. Node 73 is connected through resistor R6, fuse 56 and line 100 to node 84. $V_{out}$ is supplied through resistor R7, line 102, LED 58 and line 104 to adjust terminal 106 of the integrated circuit 80.

The resistors R1–R7 have the values specified in Table I:

TABLE I

| Resistor | Value, Ohms |
| --- | --- |
| R1 | 100 |
| R2 | 150 |
| R3 | 270 |
| R4 | 320 |
| R5 | 400 |
| R6 | 120 |
| R7 | 100 |

Input filter capacitors C1–C3 have the values shown in Table II:

TABLE II

| Capacitor | Value, microfarads |
| --- | --- |
| C1 | 470 |
| C2 | .1 |
| C3 | 1.0 |

The circuit 64 provides plating currents in a milliamperes range from rotary switch positions A to D. The switch settings A-D are selected based on the size of an object to be plated. Setting A is used for thin metal objects, such as sheet copper and the like, and provides very slow plating action. Setting B is used for small items, such as charms, filigree jewelry and the like, and provides slow plating action. Setting C is used for larger items, such as coins, rings, necklaces, printed circuit boards and the like, and provides medium plating action. Setting D is used for large items, such as trophies, bells, buckles, faucets and the like, and provides fast plating action. Setting D is also used for dip plating.

In use, the apparatus 10 is used, in principle, the same way that tank electroplating is used throughout the plating industry. The base metal to be plated must be clean and free from dirt, oils, lacquer and the like. The article to be plated must be cleaned immediately before plating, because oxidation will start to coat the surface within an hour, especially in the case of silver and copper. For a brilliant luster after plating, the base metal must be polished to a brilliant shine. A velvet effect can be obtained by not polishing the base metal. A matte finish may be obtained by using a fine emery cloth on the base metal. Where old plating is peeling, the edges must be feathered smooth so as not to show after plating repairs are made. Worn spots on a large article can be repaired without plating the entire piece.

Large articles can be successfully plated by working an area of one and one half square inches at a time, overlapping each square. When finished, polish with a soft cloth. Any streaks can be removed with a light, smooth stroke with the plating brush and solution. Plating solution of a soft cloth can be used as a polishing agent after plating a large article. Articles should not be left in the plating solution without plating action. If this is done, a film will form on the article and will have to be removed before the article can be plated successfully. When finished plating, feather with the brush or dip anode, rinse in clean water, then dry.

Brush plating with the brush anode 50 is carried out in the following manner. The bottle 36 of the gold chloride plating solution is shaken well, and approximately one ounce is poured into container 22. Approximately two ounces of the cleaning solution in bottle 32 is poured into the container 20. Approximately two ounces of the detergent solution in bottle 34 is poured into the container 18. The container 26 is filled with clean, clear water. The article to be plated is washed in the cleaning solution, then in the detergent, followed by rinsing in the water. The article is dried with a soft cloth or paper towel. The article should not be touched with bare hands, since the human skin contains oils, and plating will not occur where such oils are present. The cathode 38 is connected to the article. The power switch 60 is turned on, lighting the LED 58 to indicate that the power is on. The object to be plated is held over the container 22. The brush anode 50 is dipped into the plating solution, and the article is brushed with slow, one inch strokes, holding the brush at an approximately 45° angle and with the brush just touching the metal. The brush should be kept wet with the plating solution, as in painting. Inside the brush is a 24 kt. gold anode, which should not be allowed to touch any part of the metal being plated. Slow back and forth strokes should be repeated 10 to 20 times over each area plated. For extra heavy electroplating, after the first coating, the plated area should be buffed with a soft cloth impregnated with the plating solution and the brush plating repeated. The plated article is rinsed in clean water and buffed with a soft cloth and baking soda.

Dip plating with the apparatus 10 is carried out in the following manner. The first part of the above procedure for brush plating is carried out, but the bare 24 kt. gold dip plating anode 44 is substituted for the brush plating electrode 50 and is inserted in the plating solution in container 22, as shown in FIG. 2. The knob 62 is set to the desired level, based on the nature of the object being plated. For larger articles, the container 26 can be substituted for the container 22. The cleaned object to be plated, such as a printed circuit board 39, is connected to the cathode 38 and dipped into the gold chloride plating solution for 5 to 20 seconds. The anode 44 is moved around the object to be plated and should not touch the object. Half of the article should be plated at a time. Small articles, such as rings and coins can be plated entirely at one time. When plating is completed, the cathode 38, anode 44 and the plated article should be rinsed in clean water and dried.

It should now be readily apparent to those skilled in the art that a novel electroplating apparatus capable of achieving the stated objects of the invention has been provided. The apparatus 10 is easily portable, useful in a wide variety of locations without special facilities, and can be used without special training or experience in electroplating.

It should further be apparent to those skilled in the art that various changes in form and detail of the invention as shown and described may be made. It is intended that such changes be included within the spirit and scope of the claims appended hereto.

What is claimed is:

1. A portable electroplating apparatus for small scale electroplating of a metal object, comprising a case having a plurality of containers provided in said case for a plating solution and for preparing the metal object for electroplating, an electroplating circuit mounted in said case, an electroplating anode in said case and an electroplating cathode in said case, said electroplating circuit, electroplating anode and electroplating cathode being configured to provide an electroplating current to the metal object when the metal object is in contact with the plating solution, said electroplating circuit including a means for adjusting the electroplating current, said electroplating current adjusting means comprising a rotary switch and a plurality of different value resistors, one of each being connected to a different one of a plurality of electrical contacts of said rotary switch in a current flow path of said electrical circuit.

2. The portable electroplating apparatus of claim 1 in which said electroplating anode comprises a dip electrode configured for insertion in the electroplating solution in one of said plurality of containers.

3. The portable electroplating apparatus of claim 1 in which said electroplating anode comprises a brush plating electrode comprising a metal member embedded within bristles of the brush.

4. A portable electroplating apparatus for small scale electroplating of a metal object, comprising a case having a plurality of containers provided in said case for a plating solution and for preparing the metal object for electroplating, an electroplating circuit mounted in said case, an electroplating anode in said case and an electroplating cathode in said case, said electroplating circuit, electroplating anode and electroplating cathode being confined to provide an electroplating current to the metal object when the metal object is in contact with the plating solution, said electroplating circuit comprising an electrical cord for connection to a source of alternating current, a step down transformer having primary and secondary windings, the primary windings of said transformer being connected to said electrical cord, a rectifying diode bridge connected to the secondary windings of said transformer, and a voltage regulator circuit connected to receive rectified current from said diode bridge, said electroplating anode and cathode being connected to receive the electroplating current from said voltage regulator circuit.

5. The portable electroplating apparatus of claim 4 in which the plating solution is a gold chloride solution.

6. The portable electroplating apparatus of claim 4 in which said electroplating circuit includes a means for adjusting the electroplating current, said electroplating current adjusting means comprising a rotary switch and a plurality of different value resistors, one of each being connected to a different one of a plurality of electrical contacts of said rotary switch in a current flow path of said electrical circuit.

* * * * *